United States Patent [19]

Sato

[11] Patent Number: 4,644,539
[45] Date of Patent: Feb. 17, 1987

[54] CIRCUIT ARRANGEMENT CAPABLE OF PROHIBITING AN ACCESS TO A PART OF A CONTROL MEMORY ON OCCURRENCE OF AN ERROR IN THE PART

[75] Inventor: Masakazu Sato, Tokyo, Japan

[73] Assignee: NEC Corporation, Tokyo, Japan

[21] Appl. No.: 612,503

[22] Filed: May 21, 1984

[30] Foreign Application Priority Data

May 20, 1983 [JP] Japan ................... 58-87635

[51] Int. Cl.⁴ .................... G06F 11/16; G11C 29/00
[52] U.S. Cl. ..................... 371/11; 364/900; 365/200
[58] Field of Search ............ 371/10, 11; 364/200, 364/900; 365/200

[56] References Cited

U.S. PATENT DOCUMENTS

| | | | |
|---|---|---|---|
| 3,222,653 | 12/1965 | Rice | 371/10 X |
| 3,619,585 | 11/1971 | Edmondson | 364/200 |
| 4,346,459 | 8/1982 | Sud et al. | 371/10 X |
| 4,376,300 | 3/1983 | Tsang | 365/200 |
| 4,430,727 | 2/1984 | Moore et al. | 364/900 |
| 4,434,487 | 2/1984 | Rubinson et al. | 371/10 |
| 4,520,453 | 5/1985 | Chow | 364/900 |

Primary Examiner—Charles E. Atkinson
Attorney, Agent, or Firm—Sughrue, Mion, Zinn, Macpeak, and Seas

[57] ABSTRACT

In a circuit arrangement responsive to an address signal related to a main memory for reading each microinstruction out of a control memory with each microinstruction subjected to error detection, the control memory is divided into a plurality of compartments each of which is specified by a part of the address signal and which stores at least one of a plurality of data blocks, each consisting of a plurality of the microinstructions. When an error is detected in one microinstruction read out of one of the compartments, as a result of error detection, an erroneous compartment signal is produced by a diagnostic processing unit to specify an erroneous compartment. A modification circuit modifies the address signal part in accordance with the erroneous compartment signal to prohibit the address signal from accessing the erroneous compartment. A data block to be stored in the erroneous compartment is allotted to a normal one of the compartments under control of a control circuit.

4 Claims, 23 Drawing Figures

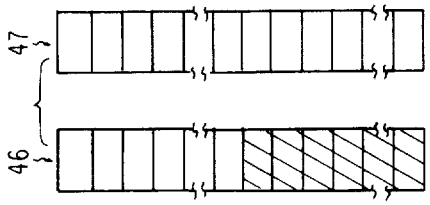
FIG. 2c
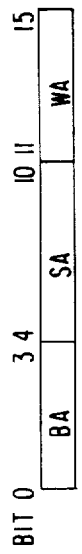
FIG. 2b
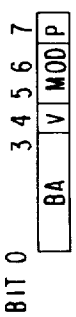
FIG. 2a
FIG. 4a
FIG. 4b

CIRCUIT ARRANGEMENT CAPABLE OF PROHIBITING AN ACCESS TO A PART OF A CONTROL MEMORY ON OCCURRENCE OF AN ERROR IN THE PART

BACKGROUND OF THE INVENTION

This invention relates to a circuit arrangement for use in processing a fault or an error occurring in a control memory including in a data processing system.

A conventional circuit arrangement of the type described comprises an error detecting circuit and an error correcting circuit together with a control memory loaded with a plurality of microinstructions. The error detecting circuit is for detecting an error of each microinstruction read out of the control memory while the error correcting circuit is for correcting the error to obtain a correct microinstruction. With this structure, each microinstruction is always sent from the control memory through both of the error detecting circuit and the error correcting circuit even when an error is not detected by the error detecting circuit. Therefore, an increase of a machine cycle is inevitable.

In another conventional circuit arrangement, the error detection alone is normally carried out for each microinstruction read out of a control memory by the use of an error detection circuit. An error correction circuit is operated only when an error is detected by the error detection circuit. With this structure, it is possible to shorten the machine cycle as compared with the above-mentioned circuit arrangement.

In the last-mentioned conventional circuit arrangement, assume an irremediable hardware error occurs in a portion of the control memory which may be called an erroneous portion. The error correction circuit should correct an error of each microinstruction each time when the erroneous portion is accessed. Therefore, it takes a long time to process each microinstruction read out of the erroneous portion. This lengthens an average time of executing the microinstructions when the hardware error occurs in the control memory.

At any rate, both of the conventional circuit arrangements carry out not only error detection but also error correction on occurrence of an error. In order to enable the error correction, each microinstruction should be formed by an error correcting code. Although the error detection alone is simply possible by addition of one or more parity bits, such as error correcting code requires extra redundant bits greater in number than the parity bit or bits, as is well known in the art. Thus, use of the error correcting code results in the control memory of an increased bit capacity.

In U.S. Pat. No. 4,010,450 issued to Porter et al and assigned to Honeywell Information Systems, a computer system is disclosed which is operable even when a hardware error occurs in a main memory. More specifically, the computer system comprises first and second addressing paths for addressing first and second portions of the main memory. When a fault, such as the hardware error, is detected on addressing the first portion of the main memory through the first addressing path, the first addressing path is switched to the second addressing path. Thus, the main memory should have the first and the second portions which are individually accessed through the first and the second addressing paths, respectively. The main memory is therefore redundant in structure.

It is difficult to apply the computer system to a circuit arrangement for use in combination with a control memory because a small capacity is often required in the control memory.

SUMMARY OF THE INVENTION

It is an object of this invention to provide a circuit arrangement which is operable even on occurrence of a hardware error in a control memory.

It is another object of this invention to provide a circuit arrangment of the type described, wherein the control memory can be effectively utilized.

It is a further object of this invention to provide a circuit arrangement of the type described, wherein high speed operation is possible even after detection of a fault.

A circuit arrangement to which this invention is applicable is for use in combination with a main memory and is responsive to an address signal related to the main memory. The circuit arrangement includes a control memory for storing a predetermined number of data blocks each of which consists of a plurality of microinstructions, address detecting means for detecting presence or absence of that one of the data block which is to be accessed by the address signal in the control memory, and error detecting means responsive to each microinstruction read out of the control memory for detecting an error therein. According to this invention, the control memory is divided into a plurality of compartments each of which is for storing at least one of the data blocks and is specifiable by a part of the address signal. The circuit arrangement comprises first means coupled to the error detecting means for producing an erroneouss compartment signal indicative of that one of the compartment which is accessed by the address signal part when the error is detected in the microinstruction read out of one of the compartments, and second means responsive to the erroneous compartment signal for prohibiting the address signal from accessing one of the compartments. The address array means is for producing the detection signal in consideration of the erroneous compartment signal.

BRIEF DESCRIPTION OF THE DRAWING

FIG. 2 is a memory map for use in describing operation of the computer system illustrated in FIG. 1;

FIG. 4 is a format for use in describing operation of the circuit arrangement illustrated in FIG. 3.

DESCRIPTION OF THE PREFERRED EMBODIMENTS

Figure 1:
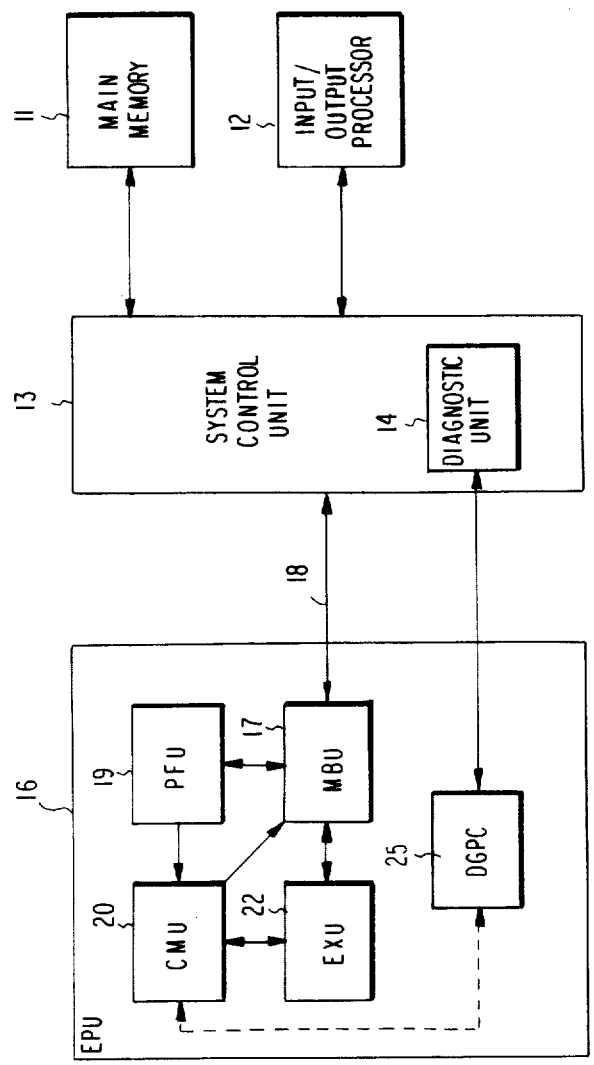
FIG. 1 is a block diagram of a general computer system to which this invention is applicable.

Referring to FIG. 1, a general electronic computer system will at first be described for a better understanding of this invention and comprises a main memory 11 and an input/output processor (IOP) 12.

Temporarily referring to FIG. 2(a), the main memory 11 is for storing a plurality of data blocks each of which consists of a plurality of words. The illustrated data blocks are equal in number to 2,048 and consecutively numbered from zero to 2,047 while the words of each block are equal in number to 32. Thus, the illustrated main memory 11 has a word capacity of 65,536. The data blocks are divided into 256 rows and 8 columns in the illustrated main memory 11. The data blocks of each row, eight in number, will collectively be referred to as a data set. The data sets are consecutively numbered from a zeroth set to a 255-th set. It should be noted here that the illustrated main memory 11 is divided into two parts, as depicted at thick lines. A first one of the parts includes the zeroth through the 127-th sets and a second one of the parts includes the 128-th through the 255-th sets.

Each word consists of 80 bits and may be a microinstruction, a datum, or a usual instruction. Such a usual instruction may simply be called an instruction. Description will mainly be directed to the microinstructions which form a microprogram and each of which includes eight lower significant bits which serve as a part of an address signal specifying a following microinstruction. Let the main memory 11 store a plurality of microprograms.

Referring back to FIG. 1, the main memory 11 and the input/output processor 12 are coupled to a system control unit 13 including a diagnostic unit 14. The system control unit 13 is also coupled to an execution processing unit (EPU) 16 and is operable as an interface between the execution processing unit 16 and both of the main memory 11 and the input/output processor 12. The system control unit 13 may be a system interface described in the above-referenced patent and will not be described in detail.

In FIG. 1, the execution processing unit 16 comprises a memory buffer unit (MBU) 17 coupled to the system control unit 13 through a data and instruction bus depicted at a single line 18. Each of the data and the instructions is transferred from the main memory 11 or from the input/output processor 12 through the system control unit 13 and the bus 18 to the memory buffer unit 17. The memory buffer unit 17 includes a cache memory loaded with the data and the macroinstructions. Such transfer of the data and the instructions are carried out in a known manner.

A pre-fetch unit (PFU) 19 is coupled to the memory buffer unit 17 to calculate an address for each instruction to be executed and to fetch the instruction in question from the memory buffer unit 17, if the instruction is stored in the memory buffer unit 17. Otherwise, the instruction is sent from the main memory 11 to the logic control unit 19 through the memory buffer unit 17 in a well-known manner. Each instruction is fetched from the main memory 11 before operation is carried out in accordance with each instruction.

Each instruction is sent from the pre-fetch unit 19 to a control memory unit (CMU) 20 comprising a circuit arrangement as will later be described in detail. The control memory unit 20 is loaded from the main memory 11 through the memory buffer unit 17 with a predetermined number of the blocks for the microprograms. Such load operation is carried out at each data block in a manner similar to transfer of the data and the instructions. It may be seen for the time being that the control memory unit 20 produces an indication in response to each instruction, in a known manner.

An execution unit (EXU) 22 is supplied with the indication and operands from the control memory unit 20 and the memory buffer unit 17, respectively. The execution unit 22 carries out a calculation with respect to the operands in accordance with each instruction and sends a result of that calculation to the memory buffer unit 17.

The execution processing unit 16 comprises a diagnostic processing controller 25 for monitoring hardware included in the execution processing unit 16 to inform the diagnostic unit 14 of occurrence of each fault. The diagnostic unit 14 puts the execution processing unit 16 into a state predetermined in accordance with each fault. As to this invention, it may be understood that the diagnostic processing controller 25 is operated in relation to the control memory unit 20, as shown at a broken line in FIG. 1.

Figure 3:
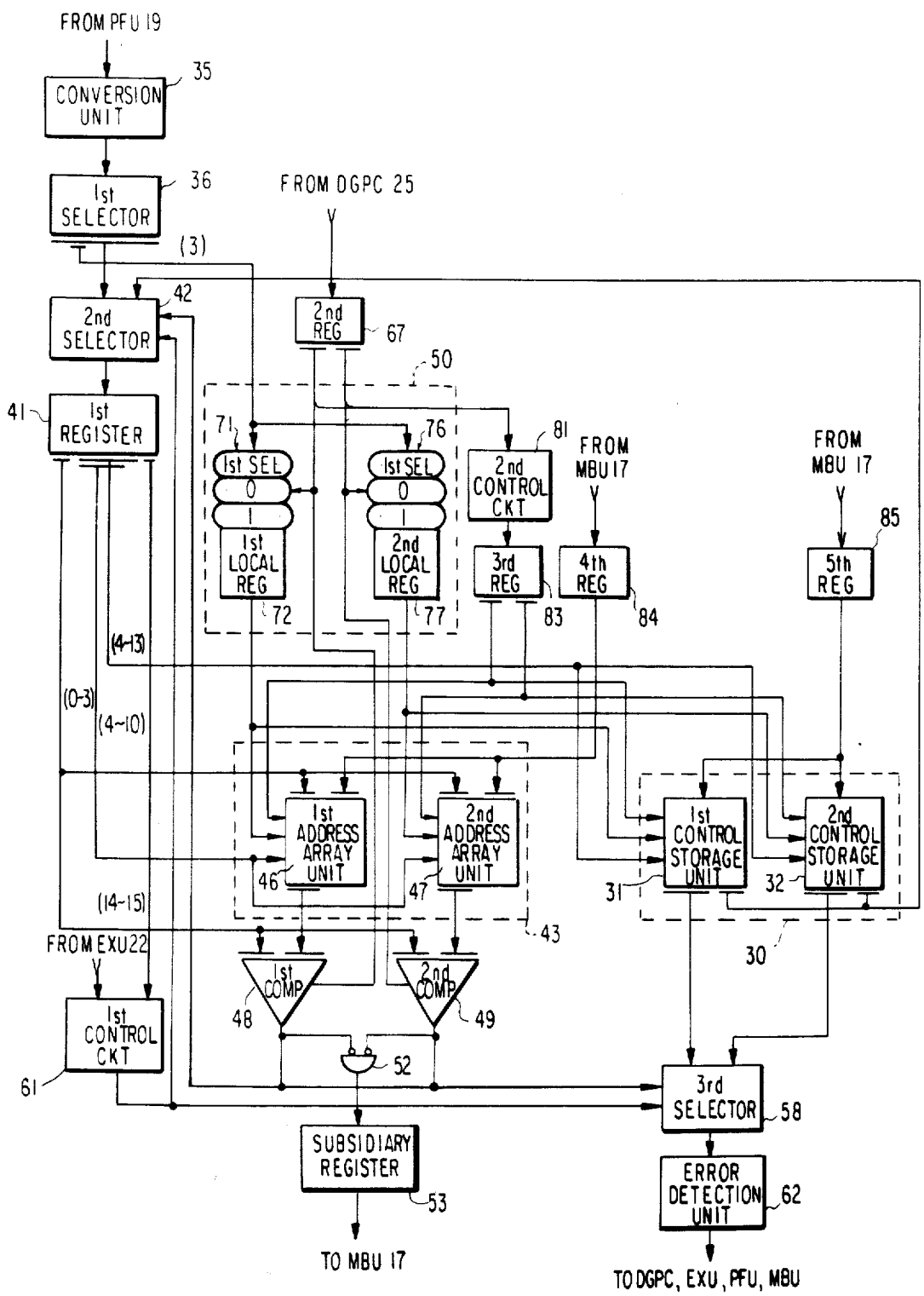
FIG. 3 is a block diagram of a circuit arrangement according to a preferred embodiment of this invention.

Referring to FIG. 3, a circuit arrangement according to a preferred embodiment of this invention serves as a part of the control memory unit 20 illustrated in FIG. 1 and comprises a control memory 30 for storing a predetermined number of the data blocks transferred from the main memory 11 (FIG. 1) through the memory buffer unit 17 (FIG. 1). In the example being illustrated, the predetermined number is equal to 512. Inasmuch as each data block consists of 32 words, the control memory 30 can be loaded with 16,384 words and may therefore be called a control memory of 16 kilowords. Each word consists of 80 bits, as mentioned in conjunction with FIG. 1. In the control memory 30, the words consist of the microinstructions.

Referring to FIG. 2(b) together with FIG. 3, the illustrated control memory 30 is divided into first and second control storage units 31 and 32 each of which has a word capacity equal to each other. The word capacity of each of the illustrated control storage units is therefore equal to 8 kilowords.

Each of the first and the second control storage units 31 and 32 consists of set areas of 256 consecutively numbered from a zeroth set area to a 255-th one. It is assumed that the known set associative method is used to load each of the first and the second control storage units 31 and 32 with each data block from the main memory 11. Under the circumstances, the zeroth through the 255-th set areas are loaded with the zeroth through the 255-th sets from the main memory 11, respectively. For example, the first set area can be loaded with the data blocks 1,257, . . . , and 1,793 while the 127-th set area, the data blocks 127, 383, . . . , and 1,919. Thus, each set area illustrated in FIG. 2(b) is loaded with eight kinds of the data blocks.

As readily understood from FIGS. 2(a) and 2(b), each of the first and the second control storage units 31 and 32 is divided into two compartments which correspond to the first and the second parts of the main memory 11, respectively. Each control storage unit is divided into one of the compartments from the zeroth set area to the 127-th one and the other from the 128-th set area to the 255-th one. In FIG. 2(b), the two compartments of the first control storage unit 31 will be called first and second compartments $C_1$ and $C_2$ while those of the second control storage unit 32, third and fourth compartments $C_3$ and $C_4$, respectively.

Inasmuch as each of the first and the second control storage memories 31 and 32 has storage addresses equal in number to 8,192 consecutively numbered from zero to 8,192, each storage address can be specified by 13 bits. On the other hand, each word or microinstruction is transferred from the main memory 11 having the word capacity of 65,536 words and is stored in each of the first and the second control storage units 31 and 32. It is necessary to indicate each main memory position where each microinstruction is transferred. The main memory positions are specifiable by 16 bits, as readily understood.

Since the word capacity of the control memory 30 is smaller than that of the main memory 11, each microinstruction is not always stored in the control memory 30. Therefore, it is inevitable that the presence or absence of each microinstruction must be stored in the control memory 30 and that a given microinstruction must be is transferred from the main memory 11 to the control memory 30, if the microinstruction in question is not stored in the control memory 30.

Let each of the address signals have 16 bits to specify each of the main memory positions in which the microinstructions are stored. In this case, each address signal does not physically specify each of the storage addresses of the control memory 30 and may therefore be called a logical address. This means that a part of the microprograms is transferred from the main memory 11 to the control memory 30.

Referring to FIG. 4(a) together with FIGS. 2(a) and 2(b), each address signal has sixteen bits consecutively numbered from a zeroth bit to a fifteenth bit and is divided into a block address portion (BA), a set address portion (SA), and a word address (WA). The block address portion (BA) is for specifying each block address arranged in each set of the main memory 11. In the example being illustrated, three bits from the zeroth to the second bit are enough for the block address portion (BA). However, the third bit is attached to the illustrated block address portion (BA) in order to specify the first and the second parts of the main memory 11 and may be considered as a most significant bit of the set address portion (SA), as will become clear as the description proceeds.

The set address portion (SA) is for specifying each set of the main memory 11 and therefore serves to indicate the set areas of each control storage unit 31 and 32. Inasmuch as the number of the sets is equal to 256 in the illustrated main memory 11, eight bits are necessary so as to specify all of the sets. However, the illustrated set address portion (SA) consists of seven bits from the fourth bit to the tenth bit. This is because each of the first and the second parts of the main memory 11 is specified by the third bit included in the block address portion (BA) and the set address portion (SA) may therefore specify the sets of 128 kinds in the example being illustrated.

The word address portion (WA) is for specifying the words in each data block consisting of 32 words. For this purpose, the word address portion (WA) consists of five bits from the eleventh bit to the fifteenth bit.

In FIG. 3, the illustrated circuit arrangement is for use in combination with a conversion unit 35 coupled to the pre-fetch unit 19 (FIG. 1). Responsive to each instruction given from the pre-fetch unit 19, the conversion unit 35 converts each instruction into a specific one of the address signals. In is assumed that the circuit arrangement is put into operation in a readout mode so as to read a specific one of the microinstructions out of the control memory 30 and that the specific address signal specifies an address for the specific microinstruction. If the specific microinstruction is placed at a leading microinstruction of a microprogram to be executed, the specific address signal points out a leading one of addresses assigned to the microprogram.

The circuit arrangement comprises a first selector 36 supplied with the specific address signal. The first selector 36 is also supplied from various registers (not shown) of the circuit arrangement with additional address signals each of which has sixteen bits. The first selector 36 selects one of the specific and the additional address signals as a selected address signal described later. The selected address signal is sent from the first selector 36 to a first register 41 through a second selector 42. Operation of the second selector 42 will be described later.

The illustrated circuit arrangement comprises an address array section 43 comprising first and second address array units 46 and 47 for the first and the second control storage units 31 and 32, respectively.

Referring to FIGS. 2(c) and 4(b) together with FIG. 3, each of the first and the second address array units 46 and 47 has 256 memory areas corresponding to the set areas of each control storage unit 31 and 32. The memory areas are loaded with entries each of which consists of 8 bits. The entries of the first and the second address array units 46 and 47 carry information for supervising the first and the second control storage units 31 and 32, respectively. More particularly, each entry has a block address part (A) of four bits, a validity bit part (V), a mode indication part (MOD) of two bits, and a parity bit part (P) for the remaining parts. The block address part (CA) corresponds to the block address portion (BA) of the address signal illustrated in FIG. 4(a). The validity bit part (V) indicates validity and invalidity of the block stored in the control memory 30 in correspondence to the block address part when it takes a logic "1" level and a logic "0" level, respectively. The mode indication part (MOD) indicates a mode of each microinstruction.

First and second comparators 48 and 49 are supplied with the block address portion of four bits from the first register 41 in the readout mode. Although operation of the illustrated comparators 48 and 49 is changed on occurrence of an error in a manner to be described later, it is assumed for the present that no error is detected in the circuit arrangement. The first and the second comparators 48 and 49 are coupled to the first and the second address array units 46 and 47, respectively, each of which is supplied with the set address portion (SA) of seven bits from the first register 41. The set address portion (SA) can specify only the sets of 128 kinds, in spite of the fact that each of the first and the second address array units 46 and 47 is loaded with the entries of 512. In order to specify the entries of 512 stored in each address array unit, the third bit of the address signal is delivered from the first selector 36 to the first and the second address array units 46 and 47 through a modification circuit 50 which will later be described in detail. For the time being, it may be understood that the third bit of the address signal is not subjected to modification by the modification circuit 50, as long as the circuit arrangement is normal. Thus, when each of the first and the second address array units 46 and 47 is supplied with the third through the tenth bits of the address signal, each of the first and the second address array units 46 and 47 reads a single one of the block address parts out of that one of array addresses which is specified by the third through the tenth bits of the address signal. The third bit given from the first selector 36 thus equivalently serves as the most significant bit of the set address portion (SA).

The block address parts (CA) read out of the first and the second address array units 46 and 47 are compared by the first and the second comparators 48 and 49 with the block address portion given from the first register 41. If a particular address signal kept in the first register 41 and one of the first and the second control storage units 31 and 32 is loaded with the data block specified by the block address portion (BA) of the particular address signal, one of the first and the second comparators 48 and 49 produces the logic "1" level indicative of coincidence between the block address portion (BA) of the particualr address signal and the block address part (CA) read out of the one of the first and the second address array units 46 and 47. When the data block in question is stored in both of the first and the second control storage units 31 and 32, both of the first and the second comparators 48 and 49 produce the logic "1" level.

On the other hand, if the data block in question is not stored in both of the first and the second control storage units 31 and 32, the logic "0" level is sent from each of the first and the second comparators 48 and 49 to a NAND gate 52. As a result, the NAND gate 52 supplies the logic "1" level through a subsidiary register 53 to the memory buffer unit 17 (FIG. 1) so as to indicate absence of the data block in question.

Thus, the address array section 43, the first and the second comparators 48 and 49, and the NAND gate 52 is operable to detect presence or absence of the data block in question. Detection of such a data block is equivalent to detection of presence or absence of a microinstruction included in the block in question.

When the absence of the block is detected, the circuit arrangement is put into a write-in mode to fetch the data block in question from the main memory. Operation of the write-in mode will be described later. Anyway, each of the first and the second comparators 48 and 49 produces a detection signal representative of a result of comparison.

The operation of the readout mode will be continued for a while. The first and the second control storage units 31 and 32 are supplied from the first register 41 with the set address portion (SA) of the selected address signal and the word address (WA). In this event, the fourteenth and the fifteenth bits of the word address (WA) are not sent to the control memory 30. This enables concurrent readout of four words from each control storage unit 31 and 32, as will become clear.

As a result, four of the microinstructions can simultaneously be read out of each of the first and the second control storage units 31 and 32 when the block in question is stored in both of the first and the second control storage units 31 and 32. Each microinstruction of 80 bits read out of the first and the second control storage units 31 and 32 includes the eight lower significant bits which indicate the part of the following microinstruction, as mentioned before. The eight lower significant bits of each microinstruction is delivered to the second selector 42 to define the part of the following microinstruction. The remaining part of each microinstruction is read out of each of the first and the second control storage units 31 and 32 and sent to a third selector 58 controllable by a first control circuit 61 and by the first and the second comparators 48 and 49.

The first control circuit 61 is supplied with the fourteenth and the fifteenth bits of the selected address signal from the first register 41 and is coupled to the execution unit 22 (FIG. 1). The execution unit 22 gives a branch condition to the first control circuit 61 in a known manner and makes the first control circuit 61 modify the fourteenth and the fifteenth bits of the selected address signal, if necessary.

As a result, the first control circuit 61 delivers a switch control signal to the third selector 58. The third selector 58 selects one of the microinstructions with reference to the switch control signal and each output signal of the first and the second comparators 48 and 49.

The switch control signal is also delivered to the second selector 42 together with the detection signal produced by each of the first and the second comparators 48 and 49.

The selected microinstruction is kept in an error detection unit 62 having a register portion of 80 bits and an error detection portion carrying out parity check with respect to the selected microinstruction. If no error is detected by the error detection unit 62, the selected microinstruction is delivered to the execution unit 22, the pre-fetch unit 19, and the memory buffer unit 17.

When occurrence of a fault or an error is detected by the error detection unit 62 as a result of the parity check, the error detection unit 62 informs the diagnostic processing controller 25 of occurrence of the fault. For this purpose, the error detection unit 62 is coupled to the diagnostic processing controller 25, as shown in FIG. 1. Such error detection is carried out after operation is completed about the selected address signal kept in the first register 41. On the other hand, the selected address signal, the switch control signal, and each detection signal of the first and the second comparators 48 and 49 are necessary to make diagnosis of the fault on detection of a fault and are therefore kept in an additional register (not shown) until completion of the diagnosis.

If an error is detected in a microinstruction read out of the control memory 30, the diagnostic processing unit 25 indicates an erroneous or faulty compartment in cooperation with the diagnostic unit 14. For this purpose, the diagnostic processing unit 25 produces an erroneous compartment signal specifying each erroneous compartment. The erroneous compartment signal has signal bits equal in number to a total of the compartments of the first and the second control storage units 31 and 32. In the example being illustrated, the number of the signal bits of the erroneous compartment signal is four numbered from a zeroth bit to third bit. The zeroth through the third bits of the erroneous compartment signal are in one-to-one correspondence to the first through the fourth compartments $C_1$ to $C_4$, respectively. Each signal bit takes the logic "1" level when the corresponding compartment is erroneous. It is readily possible to indicate such an erroneous compartment by monitoring each detection signal of the first and the second comparators 48 and 49 and the fault in the diagnostic processing controller 25.

The erroneous compartment signal is kept in a second register 67 of four bits. The second register 67 indicates an erroneous or degraded compartment or compartments and will therefore be called a degradation register (DEG). Let any hardware error occur in the second compartment $C_2$ of the first control storage unit 31, as hatched in FIG. 2(b). In other words, let the second compartment $C_2$ be degraded by such as error. In this event, only the first bit of the erroneous compartment signal takes the logic "1" level with the zeroth bit, and the second and third bits kept at the logic "0" level.

The erroneous compartment signal is delivered from the second register 67 to the modification circuit 50 and both of the first and the second comparators 48 and 49. The modification circuit 50 comprises first and second portions connected to the first and the second address array units 46 and 47, respectively. Each of the first and the second portions is operable to modify the third bit of each address signal selected by the first selector 36 in accordance with the erroneous compartment signal in a manner to presently be described when the erroneous compartment signal is indicative of occurrence of degradation of compartment or compartments.

More particularly, the first portion comprises a first local switch 71 and a first local register 72 while the second portion comprises a second local switch 76 and a second local register 77. Each of the first and the second local switches 71 and 76 is supplied with the third bit of the selected address signal from the first selector 36 and with the logic "0" and the logic "1" level signals from a signal generator (not shown) known in the art. Each of the first and the second local switches 71 and 76 selects the third bit, the logic "0" level signal, and the logic "1" level signal in accordance with two bits of the erroneous compartment signal kept in the second register, namely, the degradation register 67.

If each of the zeroth and the first bits of the erroneous compartment signal takes the logic "0" level, the third bit of the selected address signal is selected by the first local switch 71 to be kept in the first local register 72. This is because no degradation occurs in both of the first and the second compartments $C_1$ and $C_2$.

If the zeroth and the first bits of the erroneous compartment signal take the logic "0" and the logic "1" levels, respectively, the logic "0" level signal is selected by the first local switch 71 to be kept in the first local register 72. This means that the lgoic "0" level signal is produced from the first part when the second compartment is degraded.

If the zeroth and the first bits of the erroneous compartment signal take the logic "1" and the logic "0" levels, respectively, the logic "1" level signal is kept in the first local register 72 through the first local switch 71. This means that the logic "1" level is produced from the first part on occurrence of degradation in the first compartment.

If both of the zeroth and the first bits take the logic "1" level, both of the first and the second compartments $C_1$ and $C_2$ can not be utilized because of degradation of both of the first and the second compartments $C_1$ and $C_2$. Therefore, no detection signal is produced in cooperation with the first comparator 48 in a manner to be presently described.

The above-mentioned relationship applies to the second and the third bits of the erroneous compartment signal which correspond to the zeroth and the first bits thereof, respectively. Therefore, description is omitted as regards the second local switch 76 and the second local register 77.

Anyway, the first and the second parts of the modification circuit 50 produce first and second modified signals representative of results of modification when any degradation occurs in each of the first through the fourth compartments $C_1$ to $C_4$. Inasmuch as the third bit of the selected address signal also serves as the most significant bit of the set address portion (SA) as mentioned before, each of the first and the second modified signals also serves to indicate the most significant bit of the set address portion (SA).

Thus, the modification circuit is operable to modify an erroneous one of the compartments into another compartment different from the erroneous compartment when another compartment is normal.

From this fact, it is readily understood that the modification circuit 50 serves to prohibit the erroneous compartment from being accessed. More specifically, when a certain block in the erroneous compartment is accessed to be read out, the absence of the data block in question is detected by the circuit arrangement. To this end, each of the first and the second comparators 48 and 49 is controlled in consideration of the erroneous compartment signal in the following manner. When the zeroth and the first bits of the erroneous compartment signal takes the logic "1" level, both of the first and the second compartments $C_1$ and $C_2$ are degraded. In this case, the first comparator 48 produces the logic "0" level as the detection signal even when the validity bit part (V) (Fig. 4(b)) takes the logic "1" level. Similarly, the second comparator 49 produces the logic "0" level when the second and the third bits of the erroneous compartment signal takes the logic "1" level. Each of the first and the second comparators 48 and 49 produces the logic "1" level when coincidence is detected with the validity bit part (V) kept at the logic "1" level. Such operation is possible by connecting a gate circuit to each comparator.

In any event, when coincidence is not detected by each of the first and the second comparators 48 and 49, the absence of the data block in question is transferred from the circuit arrangement to the memory buffer unit 17. The circuit arrangement is thereafter put into the write-in mode, as will presently be described, to fetch the data block in question from the main memory 11 to the control memory 30. For this purpose, the memory buffer unit 17 is operated in a manner similar to that known as regards a cache memory.

Let the second compartment $C_2$ be put in a degraded state as indicated by a hatch in FIG. 2(b). Under the circumstances, when the 130-th set of the first control storage unit 31 is accessed in the readout mode, the absence of the set in question is indicated by the circuit arrangement.

In order to fetch the 130-th set from the main memory 11 to the control memory 30, the circuit arrangement is put into the write-in mode in a known manner.

In the write-in mode, a second control circuit 81 cooperates with the second register 67 to produce a control signal of two bits in response to the erroneous compartment signal of four bits stored in the second register 67. The control signal is kept in a third register 83 of two bits to be delivered from the third register 83 to the first and the second address array units 46 and 47 and to the first and the second control storage units 31 and 32. The zeroth and the first bits of the control signal are assigned to the first address array unit 46 and the first control storage unit 31 and to the second address array unit 47 and the second control storage unit 32, respectively. The logic "1" level of each of the zeroth and the first bits of the control signal serves as an enable signal for each unit.

The zeroth and the first bits of the control signal are kept at the logic "0" and the logic "1" levels, respectively, when each of the zeroth and the first bits of the erroneous compartment signal takes the logic "1" level while the zeroth and the first bits of the control signal are put into the logic "1" and the logic "0" levels, respectively, when each of the second and the third bits of the erroneous compartment signal takes the logic "1" level. In the remaining cases, the control signal is produced in a predetermined algorithm.

Figure 5A:
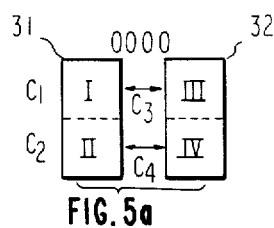
FIG. 5 is a block diagram for use in operation of the circuit arrangement illustrated in FIG. 3.
Figure 5B:
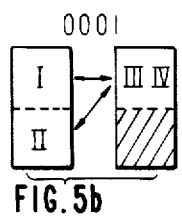
Figure 5C:
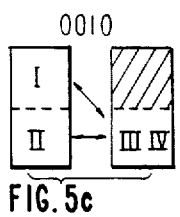
Figure 5D:
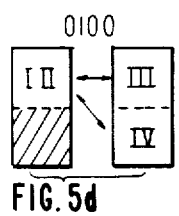
Figure 5E:
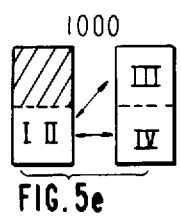
Figure 5F:
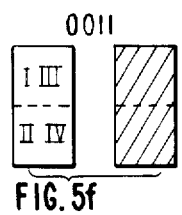
Figure 5G:
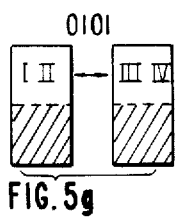
Figure 5H:
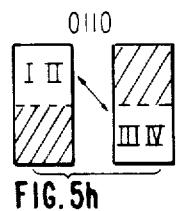
Figure 5I:
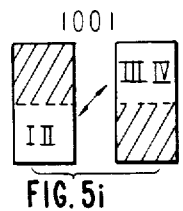
Figure 5J:
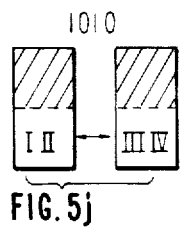
Figure 5K:
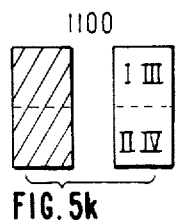
Figure 5L:
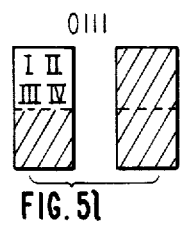
Figure 5M:
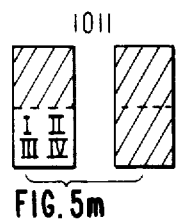
Figure 5N:
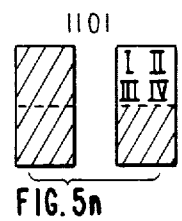
Figure 5O:
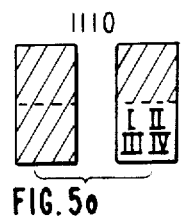

Referring to FIG. 5, either the first or the third compartment $C_1$ or $C_3$ is loaded with the sets from the zeroth set to the 127-th set (depicted at I and III) while either the second or the fourth compartment $C_2$ or $C_4$, the sets from the 128-th set to the 255-th set (II and IV) when none of the first through the fourth compartments I to IV are not degraded, as shown in FIG. 5(a). In this event, every one of the zeroth through the third bits of the erroneous compartment signal takes the logic "0" level.

As shown in FIGS. 5(b) through 5(e), when degradation takes place in one of the first through the fourth compartments, the set to be stored in the erroneous compartment is capable of being written in the remaining normal compartments in accordance with the erroneous compartment signal. Similarly, the control memory 30 can be loaded with the data sets I through IV as illustrated in FIGS. 5(f) to 5(o). Thus, the control memory is effectively utilized by allotting each set to a normal compartment even when degradation occurs in three of the compartments.

In the write-in mode, a write-in address signal of 16 bits is sent from the pre-fetch unit 19 to the first register 41 through the first and the second selectors 36 and 42 and is kept as a selected write-in address. The zeroth through the third bits of the selected write-in address are delivered to the first and the second address array units 46 and 47 to be stored therein, with the first and the second comparators 48 and 49 kept inactive. The remaining bits to be stored in the first and the second address array units 46 and 47 are sent from the memory buffer unit 17 through a fourth register 84.

Inasmuch as each of the first and the second address array units 46 and 47 is accessed by a combination of each modified signal and the set address portion (SA), a concatenation of the zeroth through the third bits and the remaining bits is stored in an array address specified by the above-mentioned combination.

Simultaneously, each of the first and the second control storage units 31 and 32 is accessed by a combination of the set address portion (SA), the word address portion (WA) of five bits, and each modified signal. On the other hand, a write-in data group of 80 bits is supplied from the memory buffer unit 17 through a fifth register 85. The write-in data group is therefore stored in a single one of the storage addresses of each control storage unit.

While this invention has thus far been described in conjunction with a preferred embodiment thereof, it will readily be possible for those skilled in the art to put this invention into various other manners. For example, the number of the compartments may not be four but two, three, five, or more. Each compartment may include at least one data block. A sole microinstruction may be read out of each of the first and the second control storage units 31 and 32. The circuit arrangement may comprise a single control storage unit, a single address array unit, and a single comparator.

What is claimed is:

1. In a circuit arrangement for use in combination with a main memory for storing a plurality of microprograms and responsive to an address signal that is related to said main memory and has a plurality of parts, said circuit arrangement including a control memory for storing a predetermined number of data blocks each of which consists of a plurality of microinstructions that are combineable to form said microprograms, address detecting means for detecting in said control memory the presence or absence of that one of the data blocks which is to be accessed by said address signal, and error detecting means responsive to each microinstruction read out of said control memory for detecting an error therein, the improvement wherein:

said control memory is divided into a plurality of compartments each of which is for storing at least one of said data blocks and which is specifiable by a first part of the address signal;

said circuit arrangement comprising:

first means coupled to said error detecting means for producing an erroneous compartment signal that indicates the one of said compartments which is accessed by the first address signal part when the error is detected in the microinstruction read out of said one of the compartments; and second means responsive to said erroneous compartment signal and coupled to said address detecting means for prohibiting the address signal from accessing said one of the compartments by changing said address signal with reference to said erroneous compartment signal.

2. A circuit arrangement as claimed in claim 1, further comprising:

third means coupled to said address array means and said control memory and responsive to said erroneous compartment signal for allotting the microinstruction read out of said one of the compartments to a normal one of the compartments.

3. A circuit arrangement as claimed in claim 1, wherein said second means comprises:

modifying means responsive to the first address signal part for modifying the first address signal part into a modified address signal in accordance with said erroneous compartment signal, said modified address signal being indicative of a particular one of the compartments that is different from said one of the compartments; and means for supplying said address array means with said modified address signal to avoid an access to said one of the compartments.

4. A circuit arrangement as claimed in claim 3, the address signal being divisible into a reception address signal and a storage address signal, wherein said address array means comprises:

an array circuit for storing a second address signal part of said storage address signal that includes the first address signal part thereof, said array circuit being accessible by that third address signal part of said reception address signal which includes the first address signal part thereof and differs from the second address signal part of said reception address signal and producing the second address signal part of said storage address signal, the first address signal part of said reception address signal being replaced by said modified address signal in response to said erroneous compartment signal; and comparing means for comparing the second address signal parts of said reception and said storage address signals to detect the presence or the absence of said one of the data blocks.

* * * * *